United States Patent
Yang

(10) Patent No.: US 8,835,100 B2
(45) Date of Patent: Sep. 16, 2014

(54) DOUBLE PATTERNING BY PTD AND NTD PROCESS

(75) Inventor: Chin Cheng Yang, Kachsiung County (TW)

(73) Assignee: Macronix International Co., Ltd., Hsin-Chu (TW)

( * ) Notice: Subject to any disclaimer, the term of this patent is extended or adjusted under 35 U.S.C. 154(b) by 10 days.

(21) Appl. No.: 13/617,540

(22) Filed: Sep. 14, 2012

(65) Prior Publication Data

US 2014/0080069 A1 Mar. 20, 2014

(51) Int. Cl.
*G03F 7/26* (2006.01)

(52) U.S. Cl.
USPC .................................. 430/312; 430/394

(58) Field of Classification Search
CPC ......... G03F 7/20; G03F 7/004; G03F 7/0035; G03F 7/0397; G03F 7/2041; G03F 7/203; G03F 7/2022; G03F 7/38; G03F 7/40; G03F 7/70466; H01L 21/0273; H01L 21/31144; H01L 21/32139; H01L 21/0274; H01L 21/308; H01L 51/0018
USPC .......................... 430/311, 394, 322, 312, 331
See application file for complete search history.

(56) References Cited

U.S. PATENT DOCUMENTS

| | | | |
|---|---|---|---|
| 6,251,564 B1 * | 6/2001 | Lin et al. | 430/311 |
| 7,501,227 B2 * | 3/2009 | Chen et al. | 430/312 |
| 2008/0187860 A1 * | 8/2008 | Tsubaki et al. | 430/270.1 |

* cited by examiner

*Primary Examiner* — Caleen Sullivan
(74) *Attorney, Agent, or Firm* — Alston & Bird LLP

(57) ABSTRACT

A method of manufacturing using a double patterning method is provided. The double patterning method uses a first developer and a second developer that are different. For example, the first developer may be a positive tone developer for a positive photoresist while the second developer may be a negative tone developer for the positive photoresist. Photoresists having a photoactive compound are also provided that may be useful in double patterning methods.

14 Claims, 13 Drawing Sheets

PTD

NTD

DOUBLE PATTERNING BY PTD AND NTD PROCESS

TECHNOLOGICAL FIELD

The present invention generally relates to a semiconductor device and a process and a method of forming a semiconductor device. In particular, the present invention relates to a semiconductor device fabricated using a double patterning lithography.

BACKGROUND

Fabrication of an integrated circuit involves processes that can generally be categorized as deposition, patterning, and doping. With the use of these different processes complex structures having various components may be built to form the complex circuitry of a semiconductor device.

Lithography is the formation of a three-dimensional patterning on the substrate to form a pattern to the substrate. A multiplicity of lithographic procedures combined with etching and/or polishing may be performed to create a final semiconductor device.

Photolithography or optical lithography involves the use of a light sensitive polymer or a photoresist that is exposed and developed to form three-dimensional patterning on a substrate. The parts of the substrate that remain covered with the photoresist will be protected from subsequent etching, ion implantation, or certain other processing techniques.

The general sequence for a photolithography process may include the steps of preparing the substrate, applying a photoresist, prebaking, exposing, post-exposure baking, developing, and post-baking. Photoresists may be applied to the substrate by any number of techniques. Generally, it is somewhat important to establish a uniform thickness of the photoresist across the substrate. Optionally, a layer of bottom anti reflectivity coating (BARC) may be applied to the substrate prior to the application of the photoresist layer. Adhesion promoters may be typically applied to the substrate prior to application of the photoresist.

In one exemplary process, the photoresist is applied to the substrate, and the substrate is then spun on a turntable at a high speed to produce the desired film. This process is known as spin coating. Without intending to be bound by theory, the thickness of the photoresist is inversely proportional to the square root of the spin speed and is directly proportional to the viscosity of the photoresist. Thus greater spin speeds lead to a thinner photoresist layer while a more viscous photoresist material leads to a thicker photoresist layer.

A photoresist that has been applied to the substrate will contain a solvent that will eventually evaporate from the photoresist. Of course, the rate of solvent removal may be accelerated by baking the photoresist. Once solvent has been partially removed from the photoresist, the adhesion of the photoresist to the substrate is improved and the photoresist layer becomes more durable. Some residual amount of solvent remaining in the photoresist—on the order of between about 3 and about 8 percent by weight—will allow the photoresist layer to remain stable during subsequent lithographic processing steps.

The premise behind photolithography is the change in solubility of the positive photoresist in a positive tone developer throughout certain regions of the photoresist that have been exposed to light, in the past visible light but more conventionally ultraviolet light, or some other form of radiation. The regions of exposure may be controlled, for example, with the use of a mask. FIG. 1A shows an exposure step of a photolithographic process. Light 10 passing through a mask 20 may only pass to certain regions, the exposed regions 30, of a positive photoresist while leaving other unexposed regions 40 in the positive tone developer (PTD) process and leaving exposed regions 30 in the negative tone developer process (NTD) process.

Exposed regions of a positive photoresist become more soluble in the PTD, while exposed regions of the positive photoresist become less soluble in a negative tone developer. By way of a non-limiting example, the positive photoresist may comprise at least one photoactive compound that is itself converted or causes the conversion of another compound to a compound that is more soluble in a PTD. By way of another non-limiting example, the positive photoresist may comprise a photoactive compound that causes an unprotected polymer to be available after exposure. The unprotected polymer will become hydrophilic and more polar, which makes it less soluble in an organic non-polar solvent.

The exposed regions 30 of a positive photoresist will be washed away by a positive tone developer leaving the unexposed regions 40 of the photoresist that have not been exposed to light. FIG. 1B illustrates a positive tone developer (PTD) patter produced from the use of a positive photoresist.

In contrast, the exposed regions 30 of the positive photoresist will remain after being contacted with a negative tone developer while the unexposed regions 40 of the positive photoresist will be washed away by the NTD. FIG. 1C illustrates a negative tone developer (NTD) image produced from the use of a positive photoresist.

Of course, the developer may be selected based upon the extent of solubility of the positive photoresist. In non-limiting examples, an aqueous 2.38 wt % tetra-methyl ammonium hydroxide solution may be used as the positive tone developer, while an organic solvent may be used as the negative tone developer.

Prior to undergoing development, the photoresist may be subjected to a post-exposure bake that may assist with smoothing standing wave ridges that have formed in the photoresist. Commonly, most positive photoresists employ the use of aqueous bases as positive tone developers. A post-bake follows development and is used to harden the final resist image allowing the remaining photoresist to better withstand subsequent etching or other processing steps. Following the subsequent processing steps, the remaining photoresist is removed from the substrate using, for example, a wet stripping process or a dry plasma stripping process.

Double patterning involves performing two lithographic processing steps. Without intending to be limiting, double patterning may be used in fabricating fine but dense patterns in a semiconductor devices. Double patterning may be particularly useful when optical resolution restrictions prevent achieving a reduced pitch in a semiconductor device. However, conventional approaches to double patterning may have issues with respect to their ability to process a semiconductor device having varying densities. Furthermore, conventional double patterning techniques may also lead to uneven or inaccurate pattern profiles depending upon the design of the semiconductor device.

There remains a need in the art for improved methods of double patterning to further reduce pitch and yet overcome many of the problems associated with more conventional double patterning processes. Furthermore, there remains a need for improved pattern designs to achieve reduced pitch in semiconductor devices.

BRIEF SUMMARY OF EXEMPLARY EMBODIMENTS

Embodiments of the present invention are therefore provided that may provide for higher resolution pitch in semiconductor devices.

An aspect of the invention provides a method of making a photoresist pattern comprising the steps of providing a photoresist layer, exposing the photoresist layer to a first light passing through a first mask, developing the photoresist layer using a first developer, exposing the photoresist layer to a second light passing through a second mask, and developing the photoresist layer using a second developer, wherein the first developer is different from the second developer. In certain embodiments of the invention, the photoresist layer comprises a positive photoresist. According to certain embodiments of the invention, the first developer is a positive tone developer, and the second developer is a negative tone developer.

In an embodiment of the invention, the photoresist layer comprises a photoactive compound that causes the photoresist to transition to a compound that dissolves in the positive tone developer over a first transition range, the first transition range is defined by a range of exposure to energy. In certain embodiments of the invention, the photoactive compound causes the photoresist to transition to another compound that does not dissolve in the negative tone developer over a second transition range, the second transition range defined by another range of exposure to energy. In certain embodiments of the invention, the first transition range and the second transition range are about the same.

Another aspect of the invention provides a method of making a photoresist pattern comprising providing a photoresist layer, exposing the photoresist layer to a first light passing through a first mask having a first line/space ratio, developing the photoresist layer using a first developer, exposing the photoresist layer to a second layer passing through a second mask having a second line/space ratio, and developing the photoresist layer using a second developer, wherein the first line/space ratio is larger than the second line/space ratio.

In certain embodiments of the invention, the first developer may be different that the second developer. According to certain embodiments of the invention, the photoresist layer may comprise a positive photoresist, and, for example, the first developer may be a positive tone developer and the second developer may be a negative tone developer.

In an embodiment of the invention, the first line/space ratio of the first mask is from about 1 to about 9. In another embodiment of the invention, the second line/space ratio of the second mask is from about 1/9 to about 9.

An aspect of the invention provides a method of making a photoresist pattern comprising the steps of exposing a photoresist with a first mask, the first mask having a first dense pattern and a periphery pattern; developing the photoresist with a first developer; exposing the photoresist with a second mask, the second mask having at least a second dense region; and developing the photoresist with a second developer, wherein the first developer and the second developer are different. According to an embodiment of the invention, the photoresist comprises a positive photoresist, the first developer is a positive tone developer, and the second developer is a negative tone developer.

In an embodiment of the invention, a dimension, such as a width, for example, of the first dense pattern is larger than a comparable dimension, such as a width, for example, of the second dense pattern.

According to certain embodiments of the invention, the first mask has a first opaque region surrounded by a substantially translucent region where the first opaque region defines a corresponding pad. The second mask may comprise a second opaque region surrounded by a substantially translucent region with the second opaque region positioned substantially at the center of the first transparent region. The second opaque region defines a separation region in the corresponding pad to form the corresponding pad into at least two portions.

The invention also provides a semiconductor device manufactured according to any of the methods of the invention.

These embodiments of the invention and other aspects and embodiments of the invention will become apparent upon review of the following description taken in conjunction with the accompanying drawings. The invention, though, is pointed out with particularity by the appended claims.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

Figure 3A:
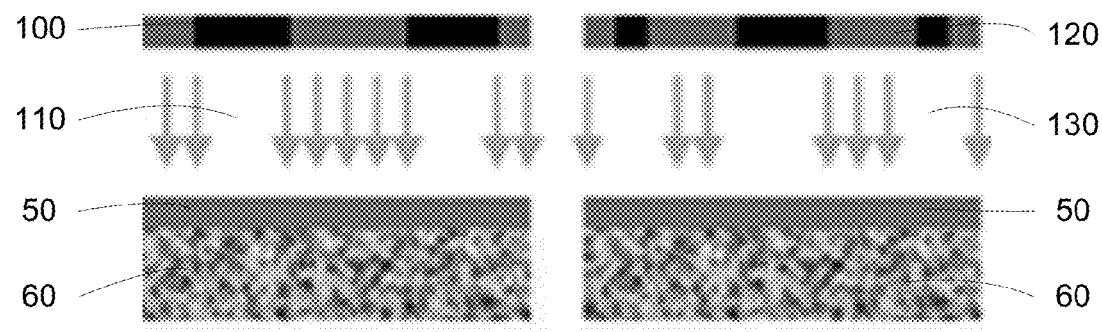
FIG. 3A illustrates a double exposure patterning method.
Figure 3B:
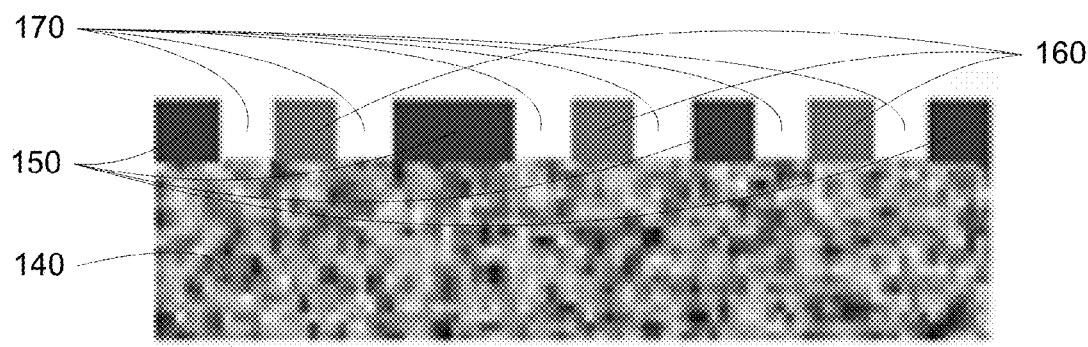
Figure 3C:
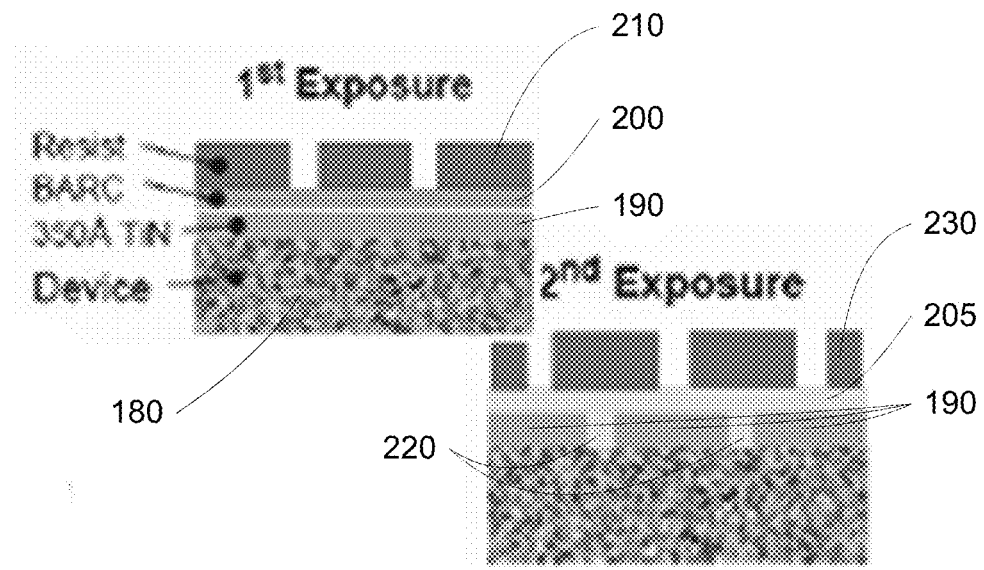
Figure 3D:
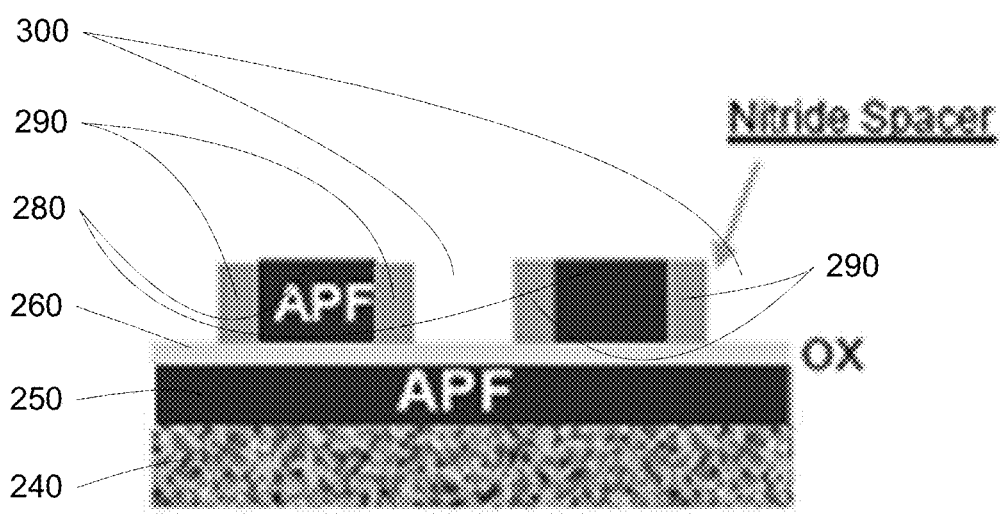
Figure 4:
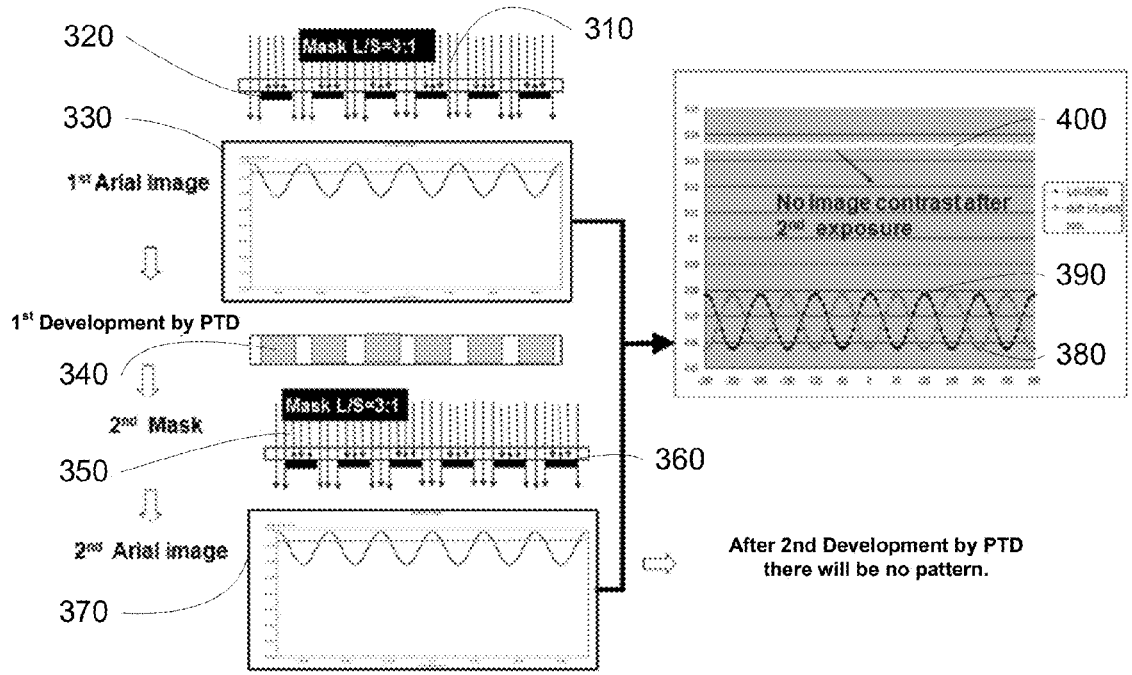
Figure 5:
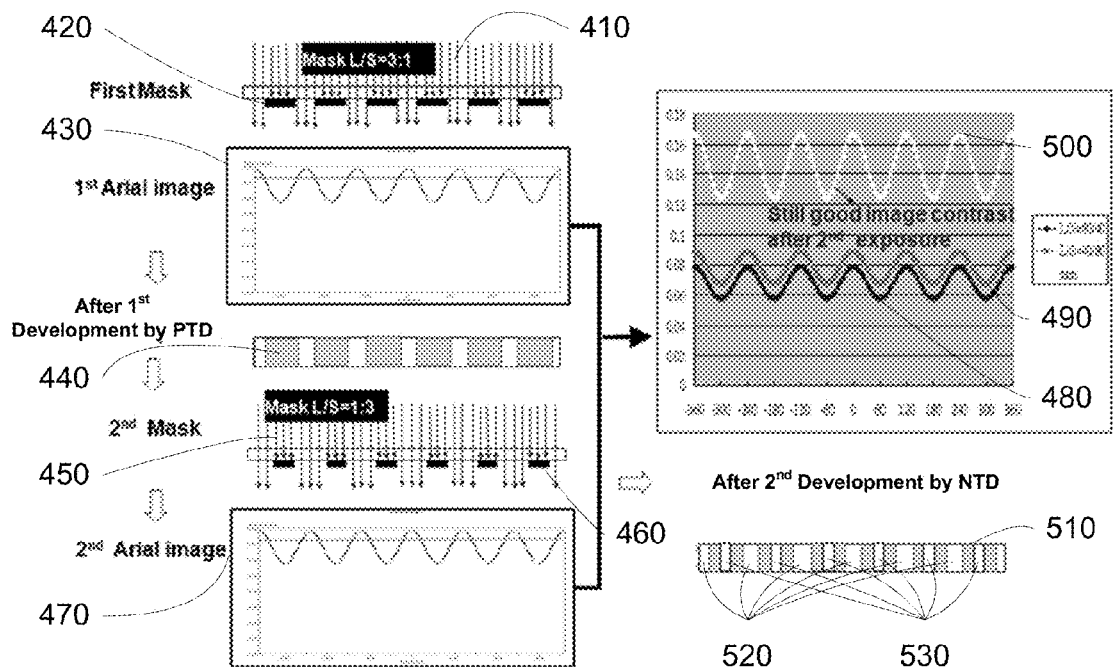
Figure 6A:
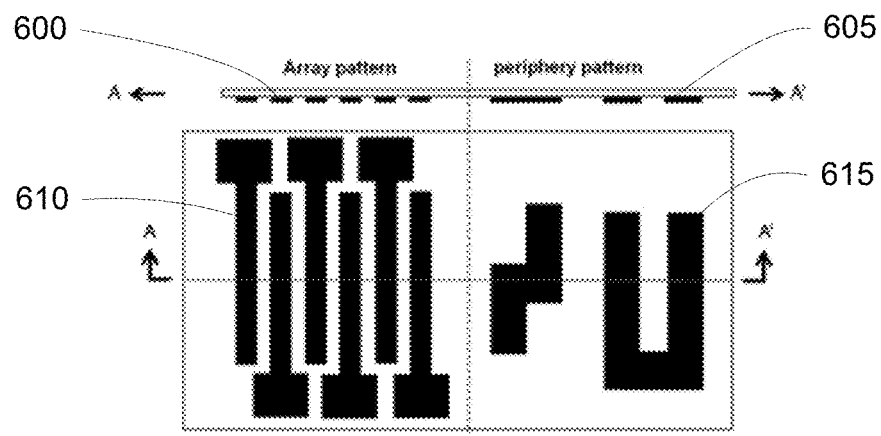
Figure 6B:
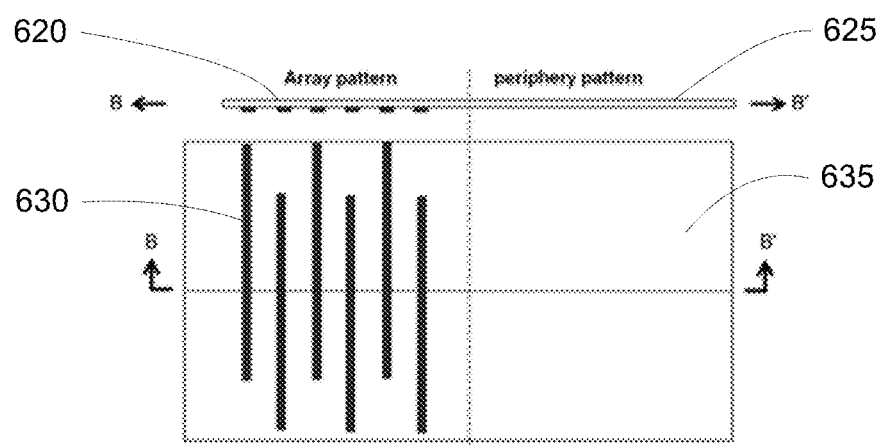
Figure 6C:
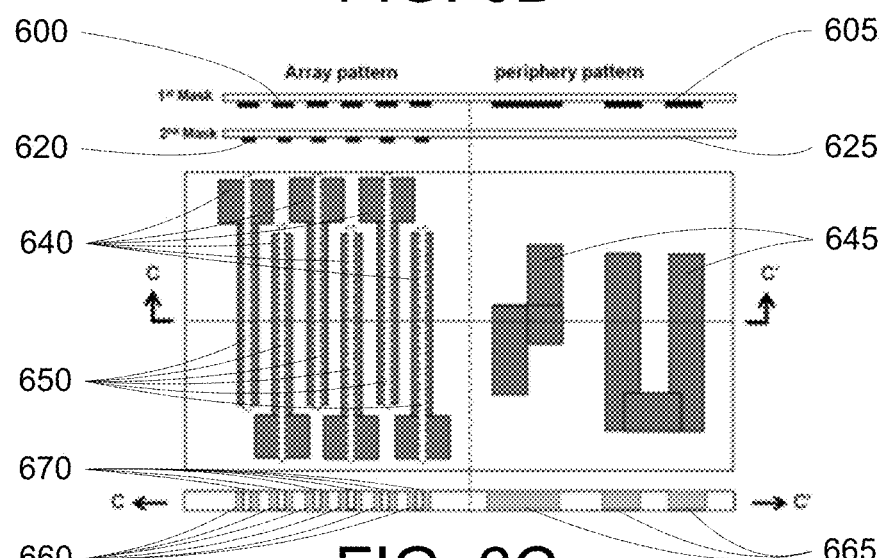
Figure 7A:
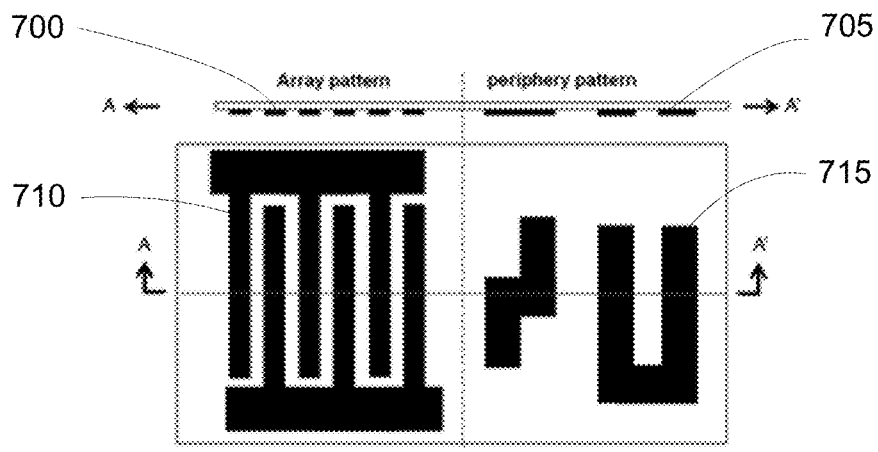
Figure 7B:
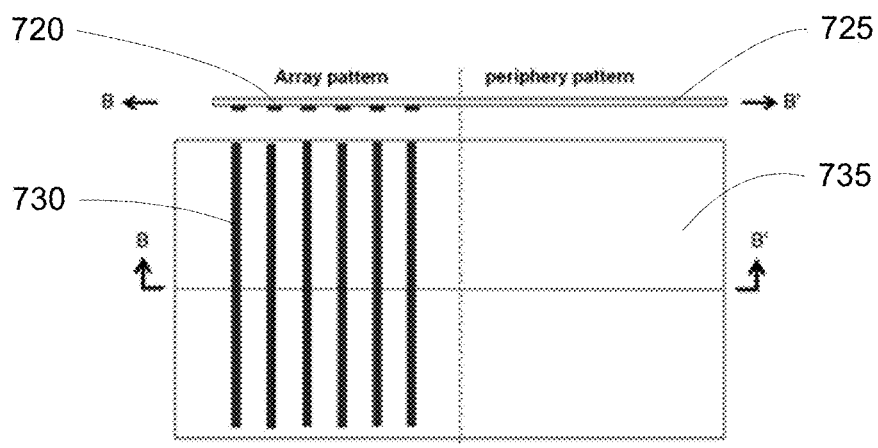
Figure 7C:
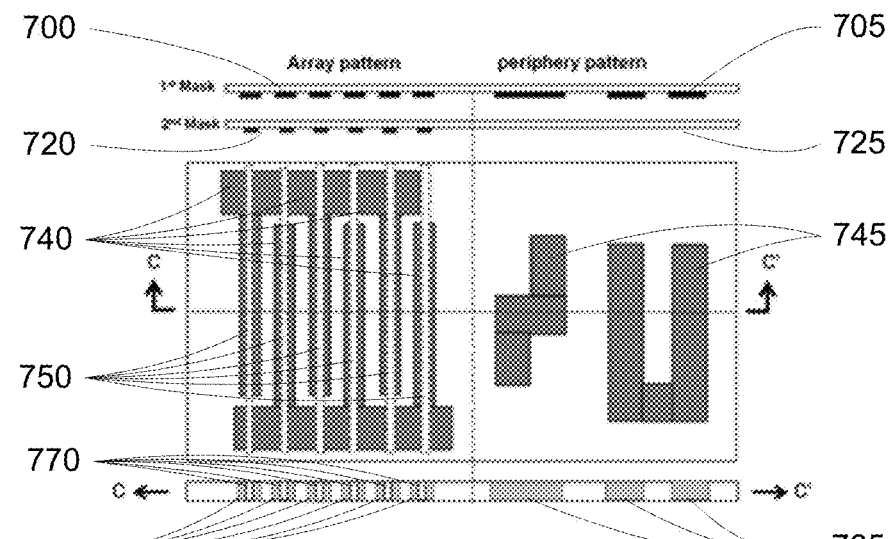
Figure 8A:
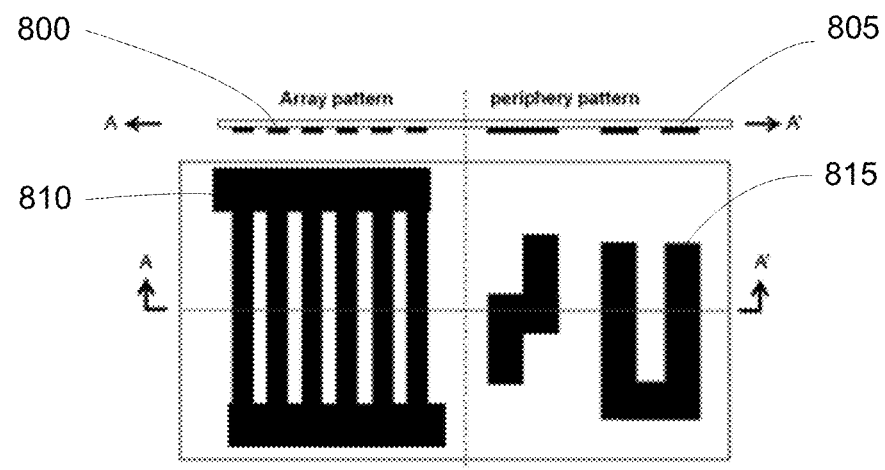
Figure 8B:
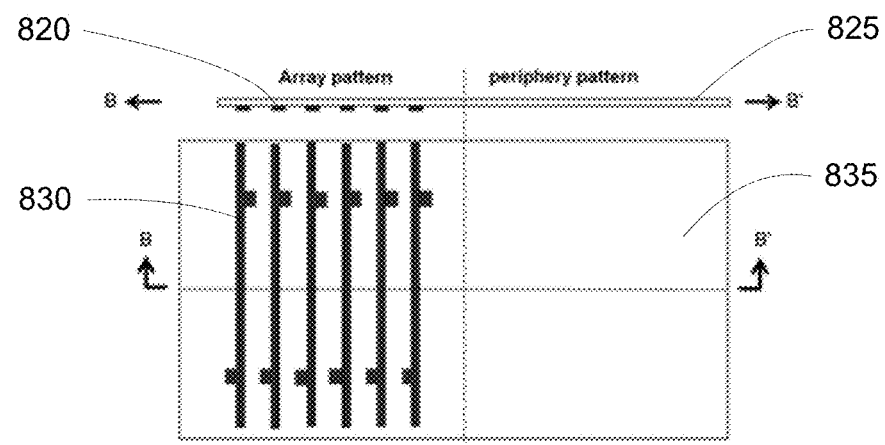
Figure 8C:
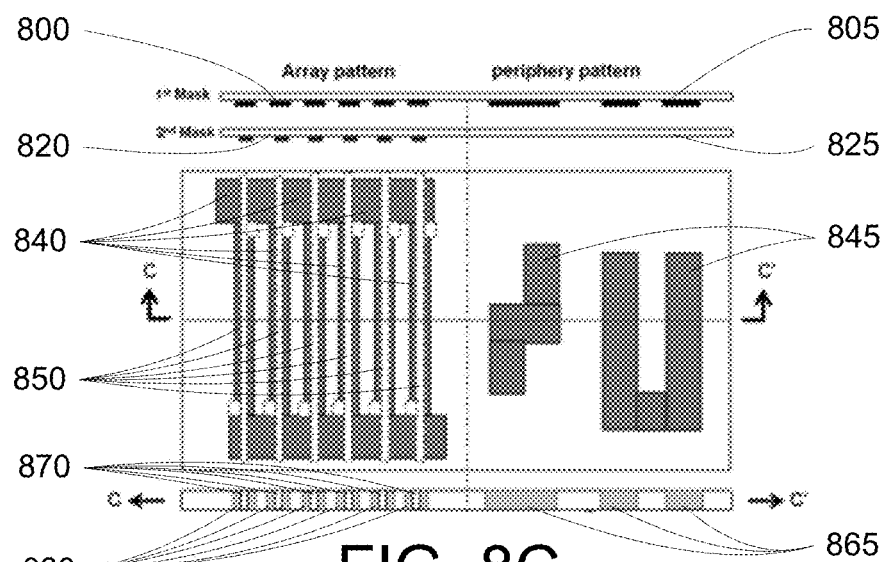
Figure 9A:
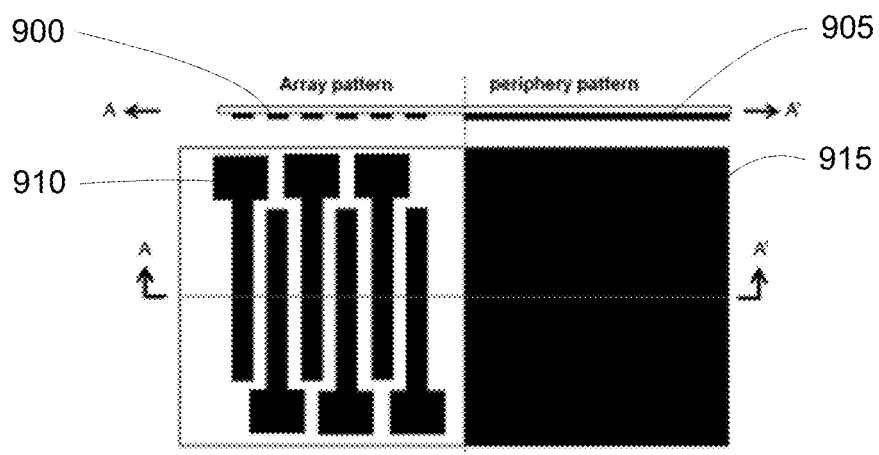
Figure 9B:
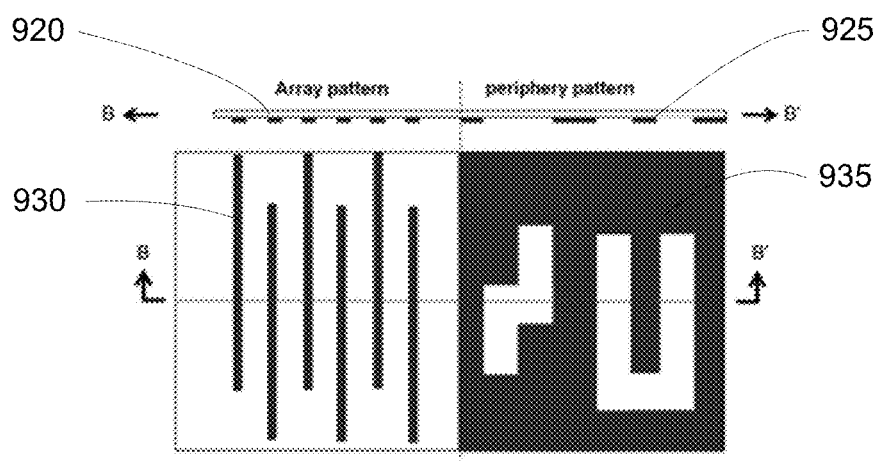
Figure 9C:
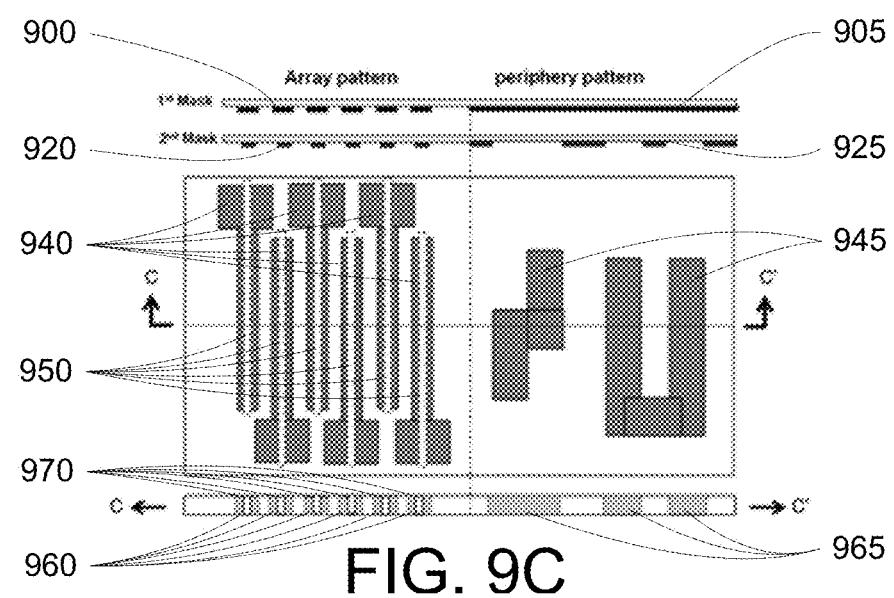
Figure 10A:
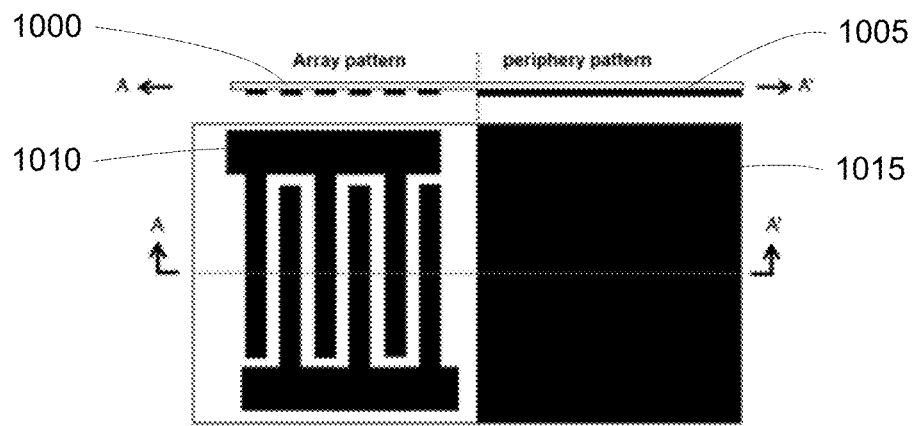
Figure 10B:
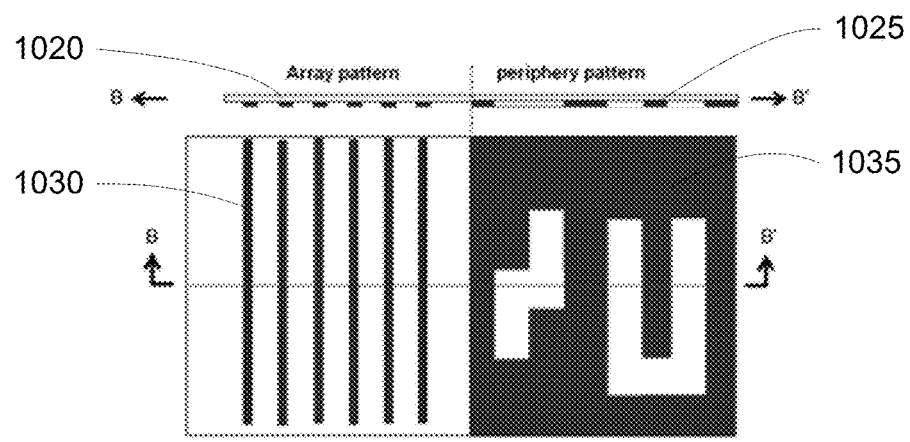
Figure 10C:
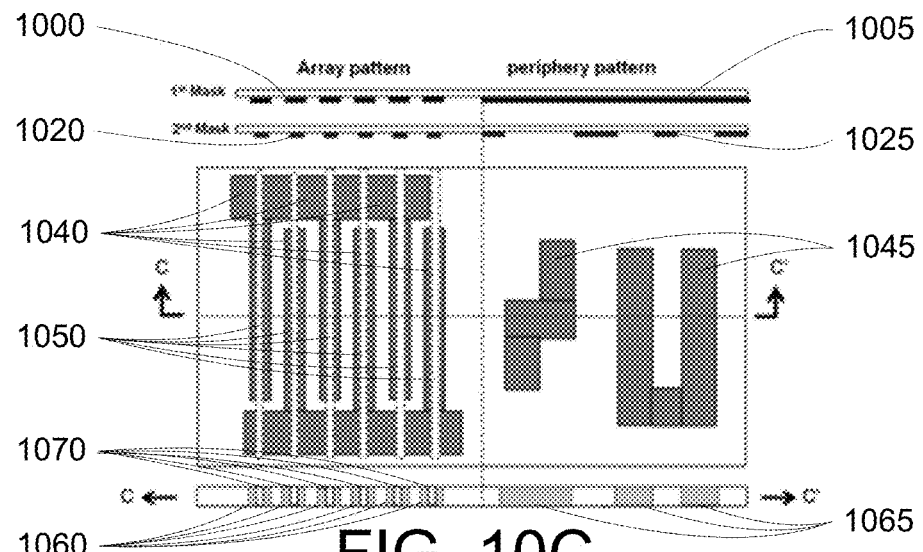
Figure 11A:
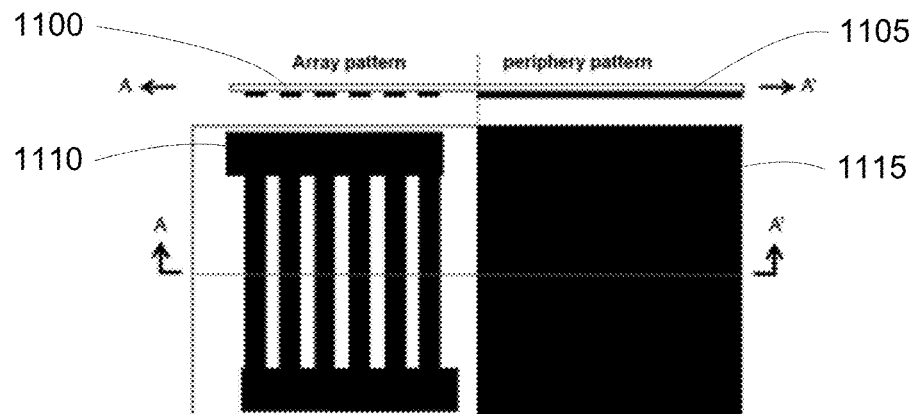
Figure 11B:
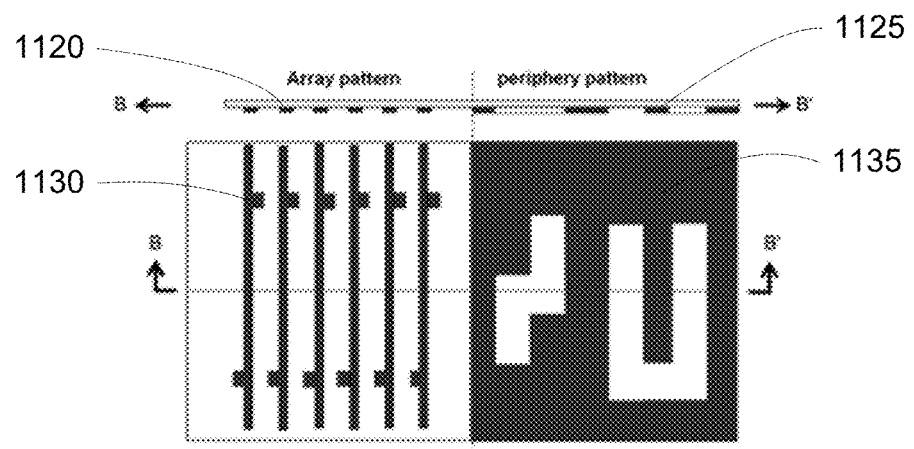
Figure 11C:
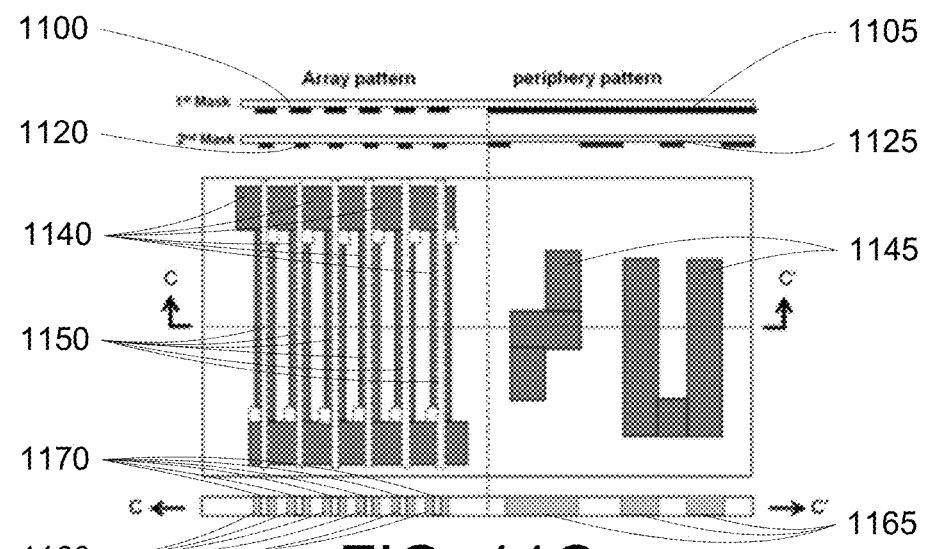
Figure 12:
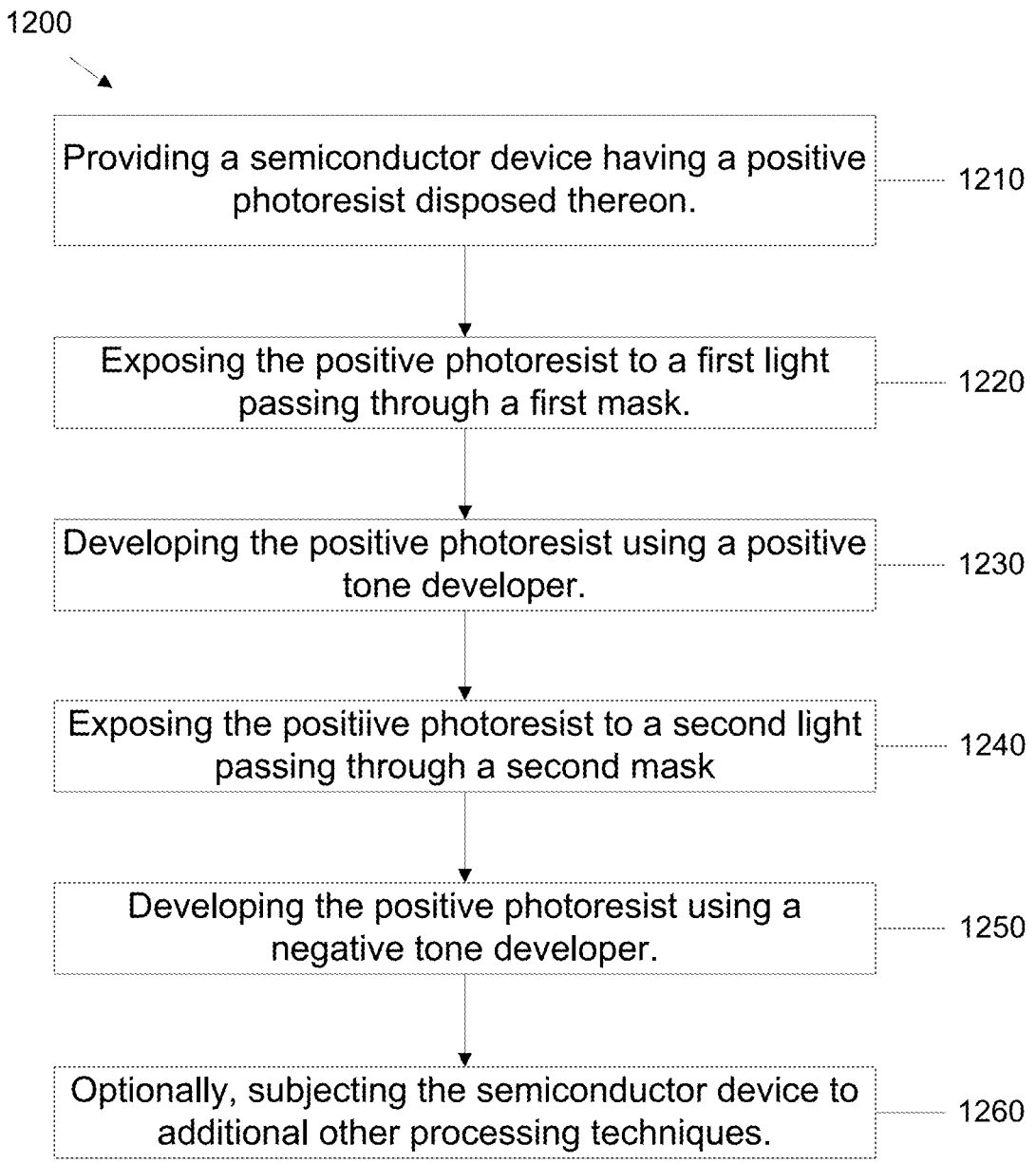

FIG. 3B a profile of a semiconductor device that has been fabricated using a double imaging patterning method;

FIG. 3C illustrates profiles of a semiconductor device following pattern formation according to a double patterning method;

FIG. 3D illustrates a profile of a semiconductor device following processing by a self-aligning double patterning method;

FIG. 4 illustrates a double patterning technique using a positive photoresist film double patterning technique using a positive photoresist film and a positive tone developer in a first development and a positive tone developer in a second development;

FIG. 5 illustrates another double patterning technique using a positive photoresist film and a positive tone developer and a negative tone developer according to an embodiment of the invention;

FIG. 6A illustrates a first mask having a first array pattern and a first periphery pattern according to an embodiment of the invention;

FIG. 6B illustrates a second mask having a second array pattern and a second periphery pattern according to an embodiment of the invention;

FIG. 6C illustrates a finished array pattern and a finished periphery pattern of the photoresist according to an embodiment of the invention;

FIG. 7A illustrates a first mask having a first array pattern and a first periphery pattern according to another embodiment of the invention;

FIG. 7B illustrates a second mask having a second array pattern and a second periphery mask according to another embodiment of the invention;

FIG. 7C illustrates a finished array pattern and a finished periphery pattern of the photoresist according to another embodiment of the invention;

FIG. 8A illustrates a first mask having a first array pattern and a first periphery pattern according to yet another embodiment of the invention;

FIG. 8B illustrates a second mask having a second array pattern and a second periphery pattern according to yet another embodiment of the invention;

FIG. 8C illustrates a finished array pattern and a finished periphery pattern of the photoresist according to yet another embodiment of the invention;

FIG. 9A illustrates a first mask having a first array pattern and a first periphery mask according to still another embodiment of the invention;

FIG. 9B illustrates a second mask having a second array pattern and a second periphery pattern according to still another embodiment of the invention;

FIG. 9C illustrates a finished array pattern and a finished periphery pattern of the photoresist according to still another embodiment of the invention;

FIG. 10A illustrates a first mask having a first array pattern and a first periphery pattern according to still yet another embodiment of the invention;

FIG. 10B illustrates a second mask having a second array pattern and a second periphery pattern according to still yet another embodiment of the invention;

FIG. 10C illustrates a finished array pattern and a finished periphery pattern of the photoresist according to still yet another embodiment of the invention;

FIG. 11A illustrates a first mask having a first array pattern and a first periphery pattern according to and still yet another embodiment of the invention;

FIG. 11B illustrates a second mask having a second array pattern and a second periphery pattern according to and still yet another embodiment of the invention;

FIG. 11C illustrates a finished array pattern and a finished periphery pattern of the photoresist according to and still yet another embodiment of the invention; and FIG. 12 illustrates a flowchart showing the steps for fabricating a semiconductor using a double patterning method according to an embodiment of the invention.

DETAILED DESCRIPTION

Some embodiments of the present invention will now be described more fully hereinafter with reference to the accompanying drawings, in which some, but not all embodiments of the invention are shown. Indeed, various embodiments of the invention may be embodied in many different forms and should not be construed as limited to the embodiments set forth herein; rather, these embodiments are provided so that this disclosure will satisfy applicable legal requirements.

As used in the specification and in the appended claims, the singular forms "a", "an", and "the" include plural referents unless the context clearly indicates otherwise. For example, reference to "a mask" includes a plurality of such masks.

Although specific terms are employed herein, they are used in a generic and descriptive sense only and not for purposes of limitation. All terms, including technical and scientific terms, as used herein, have the same meaning as commonly understood by one of ordinary skill in the art to which this invention belongs unless a term has been otherwise defined. It will be further understood that terms, such as those defined in commonly used dictionaries, should be interpreted as having a meaning as commonly understood by a person having ordinary skill in the art to which this invention belongs. It will be further understood that terms, such as those defined in commonly used dictionaries, should be interpreted as having a meaning that is consistent with their meaning in the context of the relevant art and the present disclosure. Such commonly used terms will not be interpreted in an idealized or overly formal sense unless the disclosure herein expressly so defines otherwise.

As used herein, "array pattern" refers to the pattern formed within the central region or an array area of a semiconductor device. In a fully formed integrated circuit, the array is typically densely populated with conducting lines and electrical devices that may include transistors and capacitors. The electrical devices may form a plurality of memory cells that are typically arranged in a grid pattern at the intersection of word lines and bit lines.

As may be used interchangeably herein, "periphery pattern" or "peripheral pattern" refers to the pattern formed in the periphery area of the semiconductor device. The periphery area is the area surrounding array area. The periphery area typically includes components that support the operations of, for example, the memory cells within the array area.

The system, process, and method conceived by the inventors include the use of double exposure patterning to further reduce the pitch of a semiconductor device. The invention also provides mask layouts to support dense configurations in a semiconductor device. The invention also provides semiconductor devices fabricated according the system, process, and method of the invention. Semiconductor devices having the mask patterns of the invention are also provided.

Figure 1A:
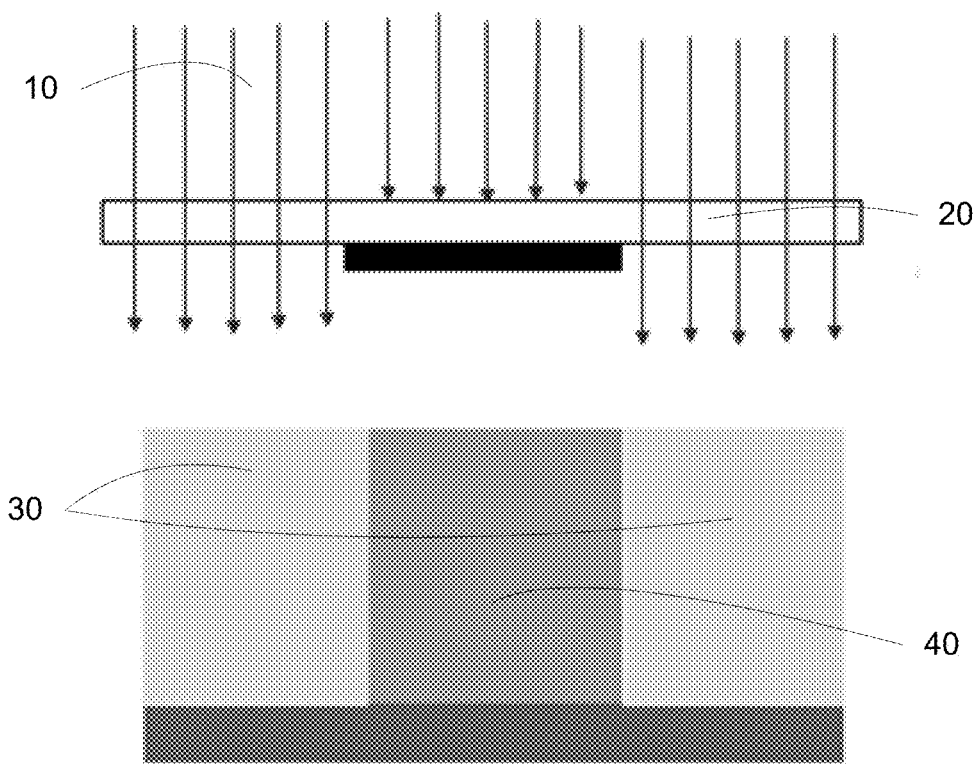
FIG. 1A illustrates an exposure step of a photolithographic process.
Figure 1B:
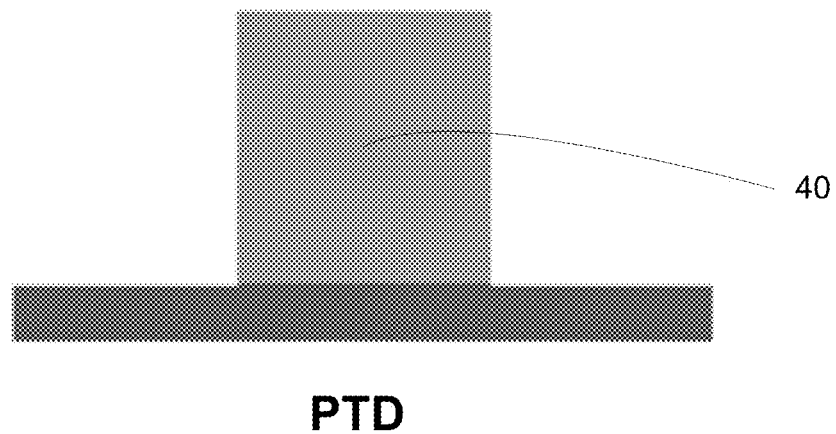
FIG. 1B illustrates a positive tone developer pattern produced from the use of a positive photoresist.
Figure 2:
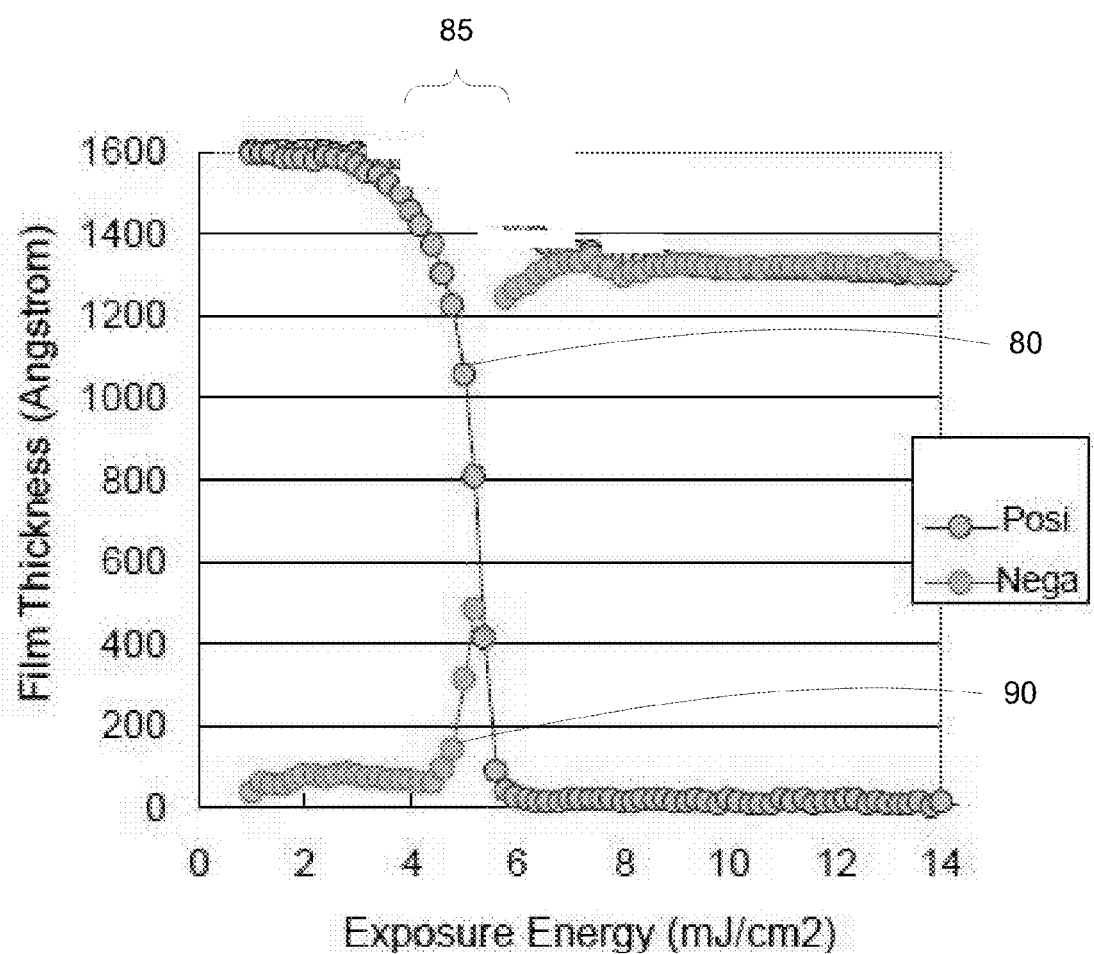
FIG. 2 is a graphical representation of the dissolution characteristics of a positive photoresist to a positive tone developer and negative tone developer according to an embodiment of the invention.

FIG. 2 is a graphical representation of the dissolution characteristics of a positive photoresist to a positive tone developer and a negative tone developer versus extent of exposure energy according to an embodiment of the invention. A photoactive compound of a positive photoresist is selected having a positive tone developer characteristic curve 80. Additionally, the photoactive compound of the positive photoresist is selected such that it has a negative tone developer characteristic curve 90. According to this exemplary embodiment, the photoactive compound is selected such that the photoactive transition range 85 is about the same for the NTD process and for the PTD process. According to FIG. 2, after an exposure to energy greater than about 5.5 mJ/cm$^2$ using a mask pattern similar to that shown in FIG. 1A, the patterned image of FIG. 1B will result after developing the positive photoresist using the positive tone developer. I.e., areas of the film that are subjected to the exposure energy no longer remain, while areas of the film that are not exposed to energy remain after development using the positive tone developer.

According to certain embodiments of the invention, the photoactive compound will cause a photoresist to be converted to a compound having different dissolution characteristics at a certain exposure energy. In certain embodiments of the invention, in NTD for example, the exposed area of the photoresist may become hydrophilic and more polar causing the exposed section of the photoresist to become less soluble in an organic non-polar solvent. In certain embodiments of the invention, in PTD for example, the exposed are of the photoresist may become more acidic causing the exposed section of the photoresist to become more soluble in an aqueous 2.38 wt % tetra-methyl ammonium hydroxide solution. Thus, in certain embodiments of the invention, the selection of the photoactive compound is such that it imparts to the photoresist these different dissolution characteristics corresponding to a negative tone developer and a positive tone developer.

Figure 1C:
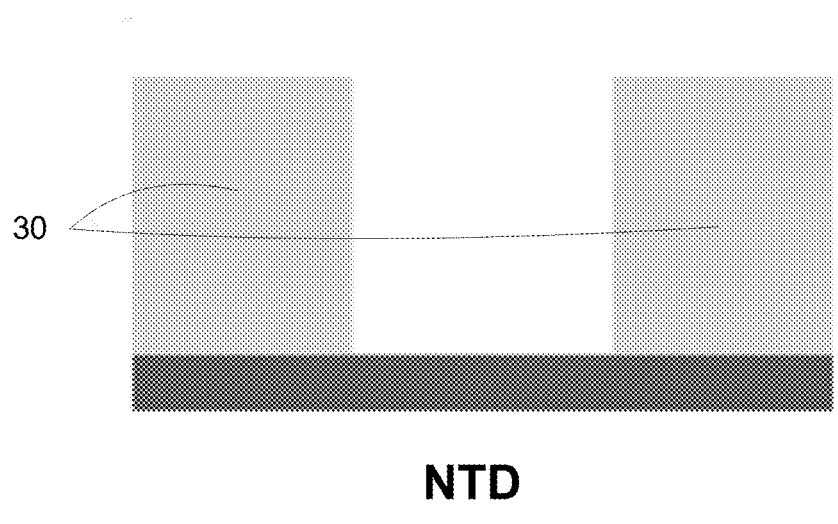
FIG. 1C illustrates a negative tone developer pattern produced from the use of a positive photoresist.

The photoactive compound of the positive photoresist also has a negative tone developer characteristic curve 90. After an exposure to energy greater than about 5 mJ/cm$^2$ using a mask pattern similar to that shown in FIG. 1A, the patterned image of FIG. 1C will result after developing the positive photoresist using the negative tone developer. I.e., areas of the film that are subjected to the exposure energy remain, while areas of the film that are unexposed no longer remain after development using the negative tone developer.

In the transition range 85, upon exposure to an energy beginning at about 4 mJ/cm$^2$ to an energy of about 6 mJ/cm$^2$, the positive photoresist, which cannot be dissolved by the positive tone developer, will transition to a compound that may be dissolved by the positive tone developer.

In contrast, upon exposure to an energy beginning at about 4 mJ/cm$^2$ to an energy of about 6 mJ/cm$^2$, the photoactive compound, which can be dissolved by the negative tone developer, will transition to another compound that cannot be dissolved by the negative tone developer.

According to an embodiment, the photoactive compound of the invention causes an exposed portion of the photoresist to transition to a first compound and a second compound. In certain embodiments of the invention, the positive tone developer may be an alkaline solution that shifts an acid-base equilibrium reaction that solvates the first compound an exposed portion of the photoresist transitions to while not capable of solvating the unexposed portions of the photoresist. In certain embodiments of the invention, the negative tone developer may be an organic solvent that is selected to solvate the photoresist while not capable of solvating the second compound an exposed portion of the photoresist transitions to. The positive photoresist, the photoactive compound, and the positive tone developer and the negative tone developer may be selected to achieve a desired responsiveness to an array of exposure energies. According to certain embodiments of the invention, the first compound and the second compound may be the same compound.

Thus, an aspect of the invention provides a positive photoresist that is capable of dissolving in a positive tone developer upon exposure to a first amount of energy and does not dissolve in a negative tone developer upon exposure to a second amount of energy. The first amount of energy and the second amount of energy may be about the same. In certain embodiments of the invention, the first amount of energy is within about 5%, within about 10%, within about 25%, within about 50%, or within about 100% of the second amount of energy.

FIGS. 3A-3D are illustrations of methods or semiconductors fabricated using various double patterning approaches. FIG. 3A illustrates a double exposure patterning method. Generally, the double exposure method involves the use of two masks in two separate exposure steps. Similar to conventional photolithographic processing techniques a photoresist 50 may be applied to a substrate 60 or other intermediate layers (not shown) that had first been applied to the substrate 60. The photoresist is exposed to light 110 passing through a first mask 100 and is then again exposed to additional light 130 passing through a second mask 120. In certain embodiments, the second mask 120 may be the first mask 100 that has be slightly reoriented. As can be further appreciated by the skilled artisan, the photoresist 50 may be exposed using a plurality of exposure steps. Following the exposure steps, the photoresist is developed using a developer.

While a double exposure method is a low cost option to improve resolution especially in denser semiconductor wafers, the current state of the art with respect to photoresist development does not allow photoresists to distinctly discern regions of the wafer that may be doubly exposed. For example, as shown in FIG. 2, the extent of transition of a photoactive compound in the photoresist depends upon the extent of exposure to energy. The photoresist does not discern whether that extent of exposure has been received in one exposure step or a multiple number of exposure steps. Thus, to fully make use of the higher resolution capability that may be provided by a double exposure technique, the exposure steps must be conducted with full consideration of the activity of the photoresist given a certain semiconductor design. This, however, is further complicated by the affect other environmental conditions may have on the transition region of the photoresist. Double exposure methods that employ a mere shift of the same mask are less prone to errors in overlay bias than double exposure techniques or other double patterning techniques that require a new mask to be properly oriented over a first or some prior exposure using a different mask. As further shown and discussed herein, double lithography patterning having double exposure provides substantially no image contrast after a first exposure and a second exposure using two aerial image combinations having dense area.

FIG. 3B illustrates a profile of a semiconductor device that has been fabricated using a double imaging patterning method. In an exemplary double imaging method, after the photoresist has been applied, the photoresist may be subjected to a first exposure step after which the photoresist is further developed and processed to freeze the photoresist. A coating may be deposited that results in the formation of plated regions 150 disposed across the surface of substrate 140. A second exposure step results in masked areas 160 that will allow a selective etching of the substrate 140 to be performed through the remaining trenches 170.

Because the double imaging patterning method requires the alignment of at least two separate masks, overlay problems as previously discussed, may result. Furthermore, after the mask has been formed following the first exposure step and the semiconductor device may be further processed, a second photoresist may not be as evenly applied to the semiconductor device since the topography of the device is quite a bit different than the typically flat topography associated with applying a photoresist directly to only a substrate.

FIG. 3C illustrates profiles of a semiconductor device following pattern formation according to a double patterning method. In the exemplary embodiment of FIG. 3C, a titanium nitride (TiN) film 190 is applied to a substrate 180 of a semiconductor device. A bottom anti-reflective coating (BARC) layer 200 is applied to the TiN film 190. A first photoresist 210 is applied to the BARC layer 200 and subjected to a first photolithographic processing step that includes exposure and development. The semiconductor device is then subjected to an etching step to remove portions 220 of the TiN film 190. A second photolithographic processing step that includes exposure and development of a second photoresist 230 may then be performed and the device subjected to further processing.

Again, because the double patterning method requires the alignment of at least two separate masks, overlay problems as previously discussed, may result. Furthermore, after the mask has been formed following the first photolithographic step and etching, a second photoresist may not be as evenly applied to the semiconductor device since the topography of the device is quite a bit different than the typically flat topography associated with applying a photoresist directly to only a substrate.

FIG. 3D illustrates a profile of a semiconductor device following processing by a self-aligning double patterning method. In the exemplary self-aligning double patterning method employed on the semiconductor of FIG. 3D, an advanced patterning film (APF) 250 is applied to a substrate 240 of a semiconductor device. A silicon oxide layer 260 may be applied to the APF 250. A patterned APF 280 is processed photolithographic by a processing method similar to the procedures as further disclosed herein. Nitride spacers 290 may be formed along the sidewalls of the patterned APF 280 according to any process known in the art in forming such nitride spacers 290. For example, a nitride material may be disposed along the surface of the semiconductor device and subjected to a partial etch to form the nitride spacers 290 disposed along the sidewalls of the patterned APF 280. Trenches 300 define open areas between the nitride spacers 290. The patterned APF 280 may be removed to define a second open area within the nitride spacers 290.

Self-aligned double patterning methods are typically good for forming semiconductor components having a one-dimensional structure, however, they become more limited in forming structures defined by differences in two- or even three-dimensions. Because self-alignment patterning methods involve the use of a single mask, there are generally no overlay problems associated with the method.

FIG. 4 represents a double lithography patterning technique using only a positive photoresist film. First light 310 passes through a first mask 320 in a first exposure and has a first aerial image 330. A resulting exposure profile of the first exposure following development using a positive tone developer is shown in a graph 340. Second light 350 passes through a second mask 360 in a second exposure to provide a second aerial image exposure profile represented in another graph 370, and the second exposure profile will form in the photoresist. For example, the first mask 320 having a mask design line/space (L/S) ratio of about 3:1 and the second mask 360 design L/S ratio of also about 3:1, but the mask open space location is one-half (½) pitch shift between the first mask 320 and the second mask 360. The energy profile for the first exposure 380 and the energy profile for the second exposure 390 result in a photoresist that provides no image contrast as shown in the combined exposure profile 400 after the second development by PTD. I.e., FIG. 4 shows there is substantially no image contrast when a first mask 320 and a second mask 360 have similar designs and the first developer and the second developer are a positive tone developer.

FIG. 5 represents a double lithography patterning technique using a positive photoresist film using both a positive tone developer and a negative tone developer according to an embodiment of the invention. First light 410 passes through a first mask 420 having an L/S ratio from about 1:1 to about 9:1, in certain embodiments of the invention, in a first exposure to produce a photoresist aerial image 430. A resulting exposure profile of the first exposure following development using a positive tone developer is shown in graph 440. Second light 450 passes through a second mask 460 having an L/S ratio of from about 1:9 to about 1:1, in certain embodiments of the invention, in a second exposure to provide a second aerial image represented by another graph 470, and a second exposure profile will form in the photoresist. There is substantially no shift between the mask open center location of the first mask 420 and the second mask 460. According to the exemplary embodiment of FIG. 5, however, the L/S ratio of the first mask 420 is about 3:1, while the L/S ratio of the second mask 460 is about 1:3.

The energy profile for the first exposure 480 and the energy profile for the second exposure 490 results in a photoresist that provides high image contrast as shown in the combined exposure profile 500. In this exemplary embodiment, a profile 510 having first photoresist spaces 520 defined by the open spaces of the first mask 420 where the first light 410 is allowed to pass is formed following development by PTD. The profile 510 also having second photoresist spaces 530 defined by the regions of the second mask 460 where second light is not allowed to pass is formed following development with NTD.

Embodiments of the invention are directed to methods of fabricating a semiconductor device using a photoresist having a first development using a first developer and a second development using a second developer and processing the semiconducting device using a double lithography process that at least involves a first exposure following the first development using the first developer and a second exposure following the second development using the second developer, the first developer and the second developer being different.

In methods directed to fabricating a semiconductor device according to certain embodiments of the invention, the photoresist may be a positive photoresist. In certain embodiments of the invention, the first developer may be a positive tone developer and the second developer may be a negative tone developer. The positive tone develop and the negative tone developer may be selected according to the disclosure as provided herein.

In certain embodiments of the invention, the positive tone developer for the positive photoresist causes those regions of the photoresist exposed to light during the first exposure to be removed. In certain embodiments of the invention, the negative tone developer for the positive photoresist causes those regions of the remaining photoresist not exposed to light during the second exposure to be removed.

The invention is also directed to semiconductor devices fabricated using the double patterning methods of the invention. The invention also provides patterns and final patterned images using certain methods of the invention. FIGS. 6A-11C are representative of exemplary embodiments when a first exposure is followed by a development using a positive tone developer and the second exposure is followed by another development using a negative tone developer.

FIG. 12 illustrates a flowchart showing the steps for fabricating a semiconductor using a double patterning method according to an embodiment of the invention. The exemplary method 1200 provides a semiconductor having disposed thereon, for example upon a substrate or a layer of the semiconductor, a positive photoresist layer 1210. The positive photoresist having positive and negative tonal imaging characteristics as disclosed herein. The positive photoresist is exposed to a first light passing through a first mask 1220. The photoresist is developed using a first developer 1230. In certain embodiments of the invention, the first developer may be a positive tone developer.

Any remaining positive photoresist may be exposed to a second light passing through a second mask 1240. The positive photoresist is developed using a second developer 1250. In certain embodiments of the invention, the second developer may be a negative tone developer. Optionally, the semiconductor may be processed using other additional processing techniques 1260. The additional processing techniques may generally be, for example, deposition, etching, and/or doping steps.

In an embodiment of the invention, FIG. 6A shows a first mask having a first array pattern 610 and a first periphery pattern 615. A cross section of the first array pattern 600 taken along the AA' line of the first array pattern 610 and a cross section of the first periphery pattern 605 taken along the AA' line of the first periphery pattern 615 are also shown.

FIG. 6B shows a second mask having a second array pattern 630 and a second periphery pattern 635. A cross section of the second array pattern 620 taken along the BB' line of the second array pattern 630 and a cross section of the second periphery pattern 625 taken along the BB' line of the second periphery pattern 635 are also shown.

According to certain embodiments of the invention, a mask may comprise an array pattern and/or a periphery pattern. For example, the mask of the exemplary embodiment illustrated in FIG. 6A comprises the first mask having the first array pattern 610 and the first periphery pattern 615. In other embodiments of the invention, such as that illustrated in FIG. 6B, a mask may comprise an array pattern 620 but there is no periphery pattern to be applied.

FIG. 6C shows a finished array pattern 640 defined in part by the pattern formed using the first array pattern 610 followed by development using the positive tone developer. Removed segments 650 of the positive photoresist have resulted from exposure of the positive photoresist to the second light using the second array pattern 630 followed by development using the negative tone developer. In this embodiment of the invention, the removed segments 650 are smaller than the array pattern formed by the first mask. Moreover, the first array pattern 610 has a first line/space ratio, and the second array pattern 630 has a second line/space ratio. In certain embodiments of the invention, the first line/space ratio is about 1 to about 9, and the second line/space ratio is about 1/9 to about 1. Therefore, according to this embodiment of the invention, the array pattern formed by the first mask can be divided into several parts by the removed segments 650 and the size defined by a dimension, such as a width, of the finished array pattern 640 can be reduced. In some embodiments of the invention, the first line/space ratio may be about 3 and the second line/space ratio may be about 1/3.

According to this embodiment, no light is masked at the periphery layer during the second exposure allowing the pattern that is formed on the positive photoresist following exposure using the first mask having the first periphery pattern 615 and development using the negative tone developer to form the finished periphery pattern 645. The positive photoresist will become resistant to the negative tone developer that is applied to the mask during the second development following complete exposure of the periphery region to the second light. Thus, the positive photoresist having the finished periphery pattern 645 results.

A cross section of the finished array pattern 660 taken along the CC' line of the finished array pattern 640 and a cross section of the finished periphery pattern 665 taken along the CC' line of the finished periphery pattern 645 are shown. The cross section of the removed segments 670 of the positive photoresist taken along the CC' line is also shown.

In another embodiment of the invention, FIG. 7A shows a first mask having a first array pattern 710 and a first periphery pattern 715. A cross section of the first array pattern 700 taken along the AA' line of the first array pattern 710 and a cross section of the first periphery pattern 705 taken along the AA' line of the first periphery pattern 715 are also shown.

FIG. 7B shows a second mask having a second array pattern 730 and a second periphery pattern 735 similar in all respects to the second array pattern 630 and the second periphery pattern 635 of FIG. 6B. However, as further discussed herein, while these masks are similar, the finished patterns will be different. A cross section of the second array pattern 720 taken along the BB' line of the second array pattern 730, and a cross section of the second periphery pattern 725 taken along the BB' line of the second periphery pattern 735 are also shown.

FIG. 7C shows a finished array pattern 740 defined in part by the pattern formed from an exposure using the first array pattern 710 followed by development using the positive tone developer. Removed segments 750 of the positive photoresist have resulted from exposure of the positive photoresist to the second light using the second array pattern 730 followed by development using the negative tone developer. Moreover, the first array pattern 710 has a first line/space ratio, and the second array pattern 730 has a second line/space ratio. In certain embodiments of the invention, the first line/space ratio is about 1 to about 9, and the second line/space ratio is about 1/9 to about 1. Therefore, according to this embodiment, the array pattern formed by the first mask may be divided into several parts by the removed segments 750 and the size defined by a dimension, such as a width, of the finished array pattern 740 that can be reduced. In some embodiments of the invention, the first line/space ratio may be about 3 and the second line/space ratio may be about 1/3.

According to this embodiment, no light is masked at the periphery layer during a second exposure allowing the pattern that is formed on the positive photoresist following exposure using the first mask having the first periphery pattern 715 and development using the negative tone developer to form the finished periphery pattern 745. The positive photoresist becomes resistant to the negative tone developer that is applied to the mask during a second development using the negative tone developer following complete exposure of the periphery region to the second light. Thus, the positive photoresist having the finished periphery pattern 745 results.

A cross section of the finished array pattern 760 taken along the CC' line of the finished array pattern 740 and a cross section of the finished periphery pattern 765 taken along the CC' line of the finished periphery pattern 745 are shown. Cross section of the removed segments 770 of the positive photoresist taken along the CC' line is also shown.

In yet another embodiment of the invention, FIG. 8A shows a first mask having a first array pattern 810 and a first periphery pattern 815. A cross section of the first array pattern 800 taken along the AA' line of the first array pattern 810 and a cross section of the first periphery pattern 805 taken along the AA' line of the first periphery pattern 815 are also shown.

FIG. 8B shows a second mask having a second array pattern 830 and a second periphery pattern 835. A cross section of the second array pattern 820 taken along the BB' line of the second array pattern 830 and a cross section of the second periphery pattern 825 taken along the BB' line of the second periphery pattern 835 are also shown.

FIG. 8C shows a finished array pattern 840 defined in part by the pattern formed from an exposure using the first array pattern 810 followed by development using the positive tone developer. Removed segments 850 of the positive photoresist have resulted from exposure of the positive photoresist to the second light using the second array pattern 830 followed by development using the negative tone developer. Moreover, the first array pattern 810 has a first line/space ratio, and the second array pattern 830 has a second line/space ratio. In certain embodiments of the invention, the first line/space ratio is about 1 to about 9, and the second line/space ratio is about 1/9 to about 1. Therefore, according to this embodiment of the invention, the array pattern formed by the first mask may be divided into several parts by the removed segments 850 and the size defined by a dimension, such as a width, of the finished array pattern 840 that can be reduced. In some embodiments of the invention, the first line/space ratio may be about 3 and the second line/space ratio may be about 1/3.

According to this embodiment, no light is masked at the periphery layer during a second exposure allowing the pattern that is formed on the positive photoresist following exposure using the first mask having the first periphery pattern 815 and development using a negative tone developer to form the finished periphery pattern 845. The positive photoresist becomes resistant to the negative tone developer that is applied to the mask during the second development following complete exposure of the periphery region to the second light. Thus, the positive photoresist having the finished periphery pattern 845 results.

A cross section of the finished array pattern 860 taken along the CC' line of the finished array pattern 840 and a cross section of the finished periphery pattern 865 taken along the CC' line of the finished periphery pattern 845 are shown. The cross section of the removed segments 870 of the positive photoresist taken along the CC' line is also shown.

In still another embodiment of the invention, FIG. 9A shows a first mask having a first array pattern 910 and a first periphery pattern 915. A cross section of the first array pattern 900 taken along the AA' line of the first array pattern 910 and a cross section of the first periphery pattern 905 taken along the AA' line of the first periphery pattern 915 are also shown.

FIG. 9B shows a second mask having a second array pattern 930 and a second periphery pattern 935. A cross section of the second array pattern 920 taken along the BB' line of the second array pattern 930 and a cross section of the second periphery pattern 925 taken along the BB' line of the second periphery pattern 935 are also shown.

FIG. 9C shows a finished array pattern 940 defined in part by the pattern formed from an exposure using the first array pattern 910 followed by development using the positive tone developer. Removed segments 950 of the positive photoresist have resulted from exposure of the positive photoresist to the second light using the second array pattern 930 followed by development using the negative tone developer. Moreover, the first array pattern 910 has a first line/space ratio, and the second array pattern 930 has a second line/space ratio. In certain embodiments of the invention, the first line/space ratio is about 1 to about 9, and the second line/space ratio is about 1/9 to about 1. Therefore, according to this embodiment of the invention, the array pattern formed by the first mask may be divided into several parts by the removed segments 950 and the size defined by a dimension, such as a width, of the finished array pattern 940 that can be reduced. In some embodiments of the invention, the first line/space ratio may be about 3 and the second line/space ratio may be about 1/3.

According to this embodiment, all light is masked from the periphery layer during the first exposure. Thus the positive photoresist remains fully resistant to the positive tone developer during the first development. The finished periphery pattern 945 becomes fully defined by the light that passes through the second periphery pattern 935. The exposed regions of the positive photoresist become resistant to the negative tone developer used in the second development allowing the finished periphery pattern 945 to be formed. The exemplary embodiments represented by FIGS. 6A-6C and FIGS. 9A-9C show there may be more than one approach to achieve the same finished positive photoresist patterns depending upon the selection of masks.

A cross section of the finished array pattern 960 taken along the CC' line of the finished array pattern 940 and a cross section of the finished periphery pattern 965 taken along the CC' line of the finished periphery pattern 945 are shown. The cross section of the removed segments 970 of the positive photoresist taken along the CC' line are also shown.

In still yet another embodiment of the invention, FIG. 10A shows a first mask having a first array pattern 1010 and a first periphery pattern 1015. A cross section of the first array pattern 1000 taken along the AA' line of the first array pattern 1010 and a cross section of the first periphery pattern 1005 taken along the AA' line of the first periphery pattern 1015 are also shown.

FIG. 10B shows a second mask having a second array pattern 1030 and a second periphery pattern 1035. A cross section of the second array pattern 1020 taken along the BB' line of the second array pattern 1030 and a cross section of the second periphery pattern 1025 taken along the BB' line of the second periphery pattern 1035 are also shown.

FIG. 10C shows a finished array pattern 1040 defined in part by the pattern formed from an exposure using the first array pattern 1010 followed by development using the positive tone developer. Removed segments 1050 of the positive photoresist have resulted from exposure of the positive photoresist to the second light using the second array pattern 1030 followed by development using the negative tone developer. Moreover, the first array pattern 1010 has a first line/space ratio, and the second array pattern 1030 has a second line/space ratio. In certain embodiments of the invention, the first line/space ratio is about 1 to about 9, and the second line/space ratio is about 1/9 to about 1. Therefore, according to this embodiment of the invention, the array pattern formed by the first mask may be divided into several parts by the removed segments 1050 and the size defined by a dimension, such as a width, of the finished array pattern 1040 that can be reduced. In some embodiments of the invention, the first line/space ratio may be about 3 and the second line/space ratio may be about 1/3.

According to this embodiment, all light is masked from the periphery layer during the first exposure. Thus the positive photoresist remains fully resistant to the positive tone developer during the first development. The finished periphery pattern 1045 becomes fully defined by the light that passes through the second periphery pattern 1035. The exposed regions of the positive photoresist become resistant to the negative tone developer used in the second development allowing the finished periphery pattern 1045 to be formed. The exemplary embodiments represented by FIGS. 7A-7C and FIGS. 10A-10C show there may be more than one approach to achieve the same finished positive photoresist patterns depending upon the selection of masks.

A cross section of the finished array pattern 1060 taken along the CC' line of the finished array pattern 1040 and a cross section of the finished periphery pattern 1065 taken along the CC' line of the finished periphery pattern 1045 are shown. The cross section of the removed segments 1070 of the positive photoresist taken along the CC' line is also shown.

And in still yet another embodiment of the invention, FIG. 11A shows a first mask having a first array pattern 1110 and a first periphery pattern 1115. A cross section of the first array pattern 1100 taken along the AA' line of the first array pattern 1110 and a cross section of the first periphery pattern 1105 taken along the AA' line of the first periphery pattern 1115 are also shown.

FIG. 11B shows a second mask having a second array pattern 1130 and a second periphery pattern 1135. A cross section of the second array pattern 1120 taken along the BB' line of the second array pattern 1130 and a cross section of the second periphery pattern 1125 taken along the BB' line of the second periphery pattern 1135 are also shown.

FIG. 11C shows a finished array pattern 1140 defined in part by the pattern formed from an exposure using the first array pattern 1110 followed by development using the positive tone developer. Removed segments 1150 of the positive photoresist have resulted from exposure of the positive photoresist to the second light using the second array pattern 1130 followed by development using the negative tone developer. Moreover, the first array pattern 1110 has a first line/space ratio, and the second array pattern 1130 has a second line/space ratio. In certain embodiments of the invention, the first line/space ratio is about 1 to about 9, and the second line/space ratio is about 1/9 to about 1. Therefore, the array pattern formed by the first mask may be divided into several parts by the removed segments 1150 and the size may be defined by a dimension, such as a width, of the finished array pattern 1140 that can be reduced. In some embodiments of the invention, the first line/space ratio may be about 3 and the second line/space ratio may be about 1/3.

According to this embodiment, all light is masked from the periphery layer during the first exposure. Thus the positive photoresist remains fully resistant to the positive tone developer during the first development. The finished periphery pattern 1145 becomes fully defined by the light that passes through the second periphery pattern 1135. The exposed regions of the positive photoresist become resistant to the negative tone developer used in the second development allowing the finished periphery pattern 1145 to be formed. The exemplary embodiments represented by FIGS. 8A-8C and FIGS. 11A-11C show there may be more than one approach to achieve the same finished positive photoresist patterns using the method of the invention depending upon the selection of masks.

A cross section of the finished array pattern 1160 taken along the CC' line of the finished array pattern 1140 and a cross section of the finished periphery pattern 1165 taken along the CC' line of the finished periphery pattern 1145 are shown. The cross section of the removed segments 1170 of the positive photoresist taken along the CC' line is also shown.

An aspect of the invention provides a method of making a photoresist pattern. For example the finished array pattern 640 may comprise the steps of exposing a photoresist in an array dense area using a first mask having, for example, a first array pattern 610; developing the photoresist using a first developer; exposing the photoresist using a second mask having, for example, a second array pattern 630; and developing the photoresist using a second developer. Of course, the first mask and/or the second mask may additional comprise a first periphery pattern and/or a second periphery pattern, respectively.

The photoresist in the array dense area has at least one photoactive compound of the invention that converts an exposed portion of the photoresist to a compound that dissolves in a positive tone developer and the photoactive compound converts the photoresist to another compound that does not dissolve in a negative tone developer. In certain embodiments of the invention, the photoresist is a positive photoresist, the first developer is the positive tone developer, and the second developer is the negative tone developer.

The first mask having the first array pattern 610 has a first opaque region surrounded by a substantially translucent region. The first opaque region defines a corresponding pad after development of the photoresist using the positive tone developer. The second mask having second array pattern 630 comprises a second opaque region surrounded by a substantially translucent region. The second opaque region is positioned substantially at the center of the first transparent region and the second opaque region defines a line of separation 650 in the corresponding pad to form a two pad region 640 after developing the photoresist using the negative tone developer.

In an embodiment of the invention, the first mask has a plurality of first opaque regions as shown in FIG. 6A for defining a plurality of corresponding pads after development of the photoresist using the positive tone developer. Further pursuant to this embodiment of the invention, the second mask has a plurality of second opaque regions that correspond to each region of the plurality of first opaque regions with these plurality of second opaque regions defining the line of separation 650 for each of the plurality of corresponding pads to form a plurality of two pad regions 640 after development of the photoresist using the negative tone developer.

The method of making the photoresist pattern may additionally comprise the steps of exposing a photoresist in a periphery area using a first mask having a first periphery pattern 615 prior to developing the photoresist with the positive tone developer and exposing the photoresist in the periphery area using a second mask having a second periphery pattern 635 prior to developing the photoresist with the negative tone developer. The first mask having the first periphery pattern 615 may have at least one opaque region surrounded by a transparent region, and the second mask having the second periphery pattern 635 may be substantially transparent. Pursuant to this embodiment of the invention, the at least one opaque region defines at least one pad 645 after development of the photoresist using the negative tone developer.

The method of making a photoresist pattern may comprise the steps of exposing a photoresist in another periphery area similar to that shown, for example, in FIGS. 9A-9C using another first mask having a first periphery pattern 915 prior to developing with the positive tone developer, and exposing the photoresist in the another periphery area using another second mask having a second periphery pattern 935 prior to developing with the negative tone developer. According to this embodiment of the invention, the another first mask having the first periphery pattern 915 may be opaque, and the another second mask having the second periphery pattern 935 may have at least one substantially transparent region surrounded by an opaque region where the at least one substantially transparent region has a shape that is substantially the same as a shape of the at least one opaque region of the first mask having the first periphery pattern 615. Further pursuant to this embodiment of the invention, the at least one substantially transparent region defines another at least one pad 945 after developing the photoresist using the negative tone developer resulting in the another at least one pad having a shape that is substantially the same as a shape of the at least one pad 645.

An aspect of the invention provides a semiconductor fabricated using the processes or methods for fabricating a semiconductor of the invention. In certain other embodiments of the invention, a semiconductor device may be fabricated using any methods as described herein.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:
1. A method of making a photoresist pattern comprising:
providing a photoresist layer;

exposing the photoresist layer to a first light passing through a first mask;

developing the photoresist layer using a positive tone developer (PTD);

exposing the photoresist layer to a second light passing through a second mask, wherein an approximately opaque region of the second mask is positioned substantially at the center of an approximately transparent region of the first mask; and developing the photoresist layer using a negative tone developer (NTD).

2. The method of claim 1, wherein the photoresist layer comprises a positive photoresist.

3. The method of claim 2, wherein the photoresist layer comprises a photoactive compound having a first transition range defined by a first range of exposure to energy and the positive photoresist transitions over the first transition range to a first compound that dissolves in the positive tone developer.

4. The method of claim 3, wherein the photoactive compound having a second transition range defined by a second range of exposure to energy and the positive photoresist transitions over the second transition range to a second compound that does not dissolve in the negative tone developer.

5. The method of claim 4, wherein the first transition range and the second transition range are about the same.

6. A method of making a photoresist pattern comprising:
providing a photoresist layer;
exposing the photoresist layer to a first light passing through a first mask having a first line/space ratio;
developing the photoresist layer using a positive tone developer (PTD);
exposing the photoresist layer to a second light passing through a second mask having a second line/space ratio, wherein an approximately opaque region of the second mask is positioned substantially at the center of an approximately transparent region of the first mask; and developing the photoresist layer using a negative tone developer (NTD),
wherein the first line/space ratio is larger than the second line/space ratio.

7. The method of claim 6, wherein the photoresist layer comprises a positive photoresist.

8. The method of claim 6, wherein the first line/space ratio is from about 1 to about 9.

9. The method of claim 6, wherein the second line/space ratio is from about 1/9 to about 1.

10. A method of making a photoresist pattern comprising:
exposing a photoresist with a first mask having a first dense pattern and a periphery pattern;
developing the photoresist with a positive tone developer (PTD);
exposing the photoresist with a second mask having a second dense pattern, wherein an opaque region of the second mask is positioned substantially at the center of an transparent region of the first mask; and
developing the photoresist with a negative tone developer (NTD).

11. The method of claim 10, wherein the photoresist comprises a positive photoresist.

12. The method of claim 10, wherein a dimension of the first dense pattern is larger than a dimension of the second dense pattern.

13. The method of claim 10, wherein:
the first mask comprising a first opaque region and a first substantially translucent region surrounding the first opaque region.

14. The method of claim 13, wherein the first opaque region defines a corresponding pad and the opaque region of the second mask defines a separation region to divide the corresponding pad into at least two portions.

* * * * *